United States Patent
Jin et al.

(10) Patent No.: US 9,923,261 B2
(45) Date of Patent: Mar. 20, 2018

(54) MOUNTING MODULE AND ANTENNA APPARATUS

(71) Applicant: Samsung Electro-Mechanics Co., Ltd., Suwon-si (KR)

(72) Inventors: Se Min Jin, Suwon-si (KR); Min Hoon Kim, Suwon-si (KR); Eun Kyoung Kim, Suwon-si (KR); Seung Goo Jang, Suwon-si (KR); Hyung Geun Ji, Suwon-si (KR); Jae Hyun Chang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/992,231

(22) Filed: Jan. 11, 2016

(65) Prior Publication Data

US 2016/0276734 A1  Sep. 22, 2016

(30) Foreign Application Priority Data

Mar. 18, 2015 (KR) .................. 10-2015-0037317

(51) Int. Cl.
| | |
|---|---|
| *H01Q 1/22* | (2006.01) |
| *H01Q 9/06* | (2006.01) |
| *H01Q 21/06* | (2006.01) |
| *H01Q 21/28* | (2006.01) |
| *H01Q 21/00* | (2006.01) |

(52) U.S. Cl.
CPC .......... *H01Q 1/2283* (2013.01); *H01Q 9/065* (2013.01); *H01Q 21/065* (2013.01); *H01Q 21/28* (2013.01); *H01L 2223/6677* (2013.01); *H01L 2224/16227* (2013.01); *H01L 2224/16235* (2013.01); *H01L 2224/32225* (2013.01); *H01L 2224/73204* (2013.01); *H01L 2924/15311* (2013.01); *H01Q 21/0075* (2013.01)

(58) Field of Classification Search
CPC ...... H01Q 1/2283; H01Q 9/065; H01Q 21/28; H01Q 1/38
USPC .................................................. 343/700 MS
See application file for complete search history.

(56) References Cited

U.S. PATENT DOCUMENTS

| | | | | |
|---|---|---|---|---|
| 4,218,682 A | * | 8/1980 | Frosch ...................... | H01Q 5/40 343/700 MS |
| 4,987,424 A | * | 1/1991 | Tamura .................. | H01Q 1/085 343/795 |
| 6,639,558 B2 | * | 10/2003 | Kellerman ........... | H01Q 9/0414 343/700 MS |
| 7,079,079 B2 | * | 7/2006 | Jo .......................... | H01Q 1/243 343/700 MS |
| 7,764,236 B2 | * | 7/2010 | Hill ........................ | H01Q 1/243 343/702 |

(Continued)

FOREIGN PATENT DOCUMENTS

| | | |
|---|---|---|
| JP | 2002-271133 A | 9/2002 |
| JP | 2003-32035 A | 1/2003 |

*Primary Examiner* — Dameon E Levi
*Assistant Examiner* — Hasan Islam
(74) *Attorney, Agent, or Firm* — NSIP Law

(57) ABSTRACT

Disclosed is a mounting module, an antenna apparatus, and a method of manufacturing a mounting module. The mounting module includes a board; an antenna mounted on a first surface of the board, an RF circuit unit mounted on a second surface of the board, and a feeding line to electrically connect the RF circuit unit and the antenna through the board, thereby reducing a loss of signal power.

14 Claims, 4 Drawing Sheets

(56) References Cited

U.S. PATENT DOCUMENTS

| | | | |
|---|---|---|---|
| 8,384,596 B2* | 2/2013 | Rofougaran | H01Q 1/2283 343/700 MS |
| 8,786,509 B2* | 7/2014 | Johnson | H01Q 21/20 343/700 MS |
| 2003/0027532 A1 | 2/2003 | Ito et al. | |
| 2010/0060526 A1* | 3/2010 | Cheng | H01Q 1/38 343/700 MS |
| 2014/0145883 A1* | 5/2014 | Baks | H01Q 1/2283 343/700 MS |
| 2016/0172761 A1* | 6/2016 | Garcia | H01Q 21/28 343/700 MS |

* cited by examiner

MOUNTING MODULE AND ANTENNA APPARATUS

CROSS-REFERENCE TO RELATED APPLICATION(S)

This application claims the priority to, and benefit under 35 USC 119(a) of Korean Patent Application No. 10-2015-0037317 filed on Mar. 18, 2015 in the Korean Intellectual Property Office, the entire disclosure of which is incorporated herein by reference for all purposes.

BACKGROUND

1. Field

The following description relates to a mounting module, an antenna apparatus, and a method of manufacturing a mounting module.

2. Description of Related Art

Mounting modules having a large capacity have been miniaturized. Therefore, highly integrated RF circuits may be mounted on mounting modules in order to implement a system in package (SiP) module. RF signals processed by the RF circuits may be transmitted or received through an antenna. Therefore, the RF circuits need to be appropriately connected to the antenna.

The RF circuits mounted on existing mounting modules may be connected to an external antenna. In this configuration, the RF circuits and the antenna may be connected to each other by an RF cable or a micro strip line. However, such a connection may increase signal power loss and deteriorate reflective characteristics.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a mounting module, including a board, an antenna mounted on a first surface of the board, an RF circuit unit mounted on a second surface of the board, and a feeding line to electrically connect the RF circuit unit and the antenna through the board.

The antenna may include at least one of a dipole antenna, a monopole antenna, or a patch antenna.

The patch antenna may be closer to a center of the first surface than at least one of the dipole antenna and the monopole antenna.

The mounting module may include an interlayer antenna disposed in the interior of the board.

The mounting module may include a via antenna disposed adjacent to a side surface of the board.

The via antenna may be perpendicular to the first surface.

The via antenna may be implemented in consideration of at least one of a frequency, a wavelength, or an interlayer thickness of a Printed Circuit Board (PCB).

The mounting module may include a frame disposed on the second surface of the board to enclose the RF circuit unit, and an area of the board enclosed by the frame may be filled with an epoxy molding compound (EMC) resin.

In another general aspect, there is provided an antenna apparatus, including a radiator disposed on a first surface of a board to transmit or receive an RF signal, and a feeder configured to receive the RF signal through a second surface of the board and to transmit the RF signal to the radiator.

The radiator may include at least two of a first radiator disposed in a center of the first surface, a second radiator disposed in an edge of the first surface, a third radiator disposed in an interlayer of the board, and a fourth radiator disposed adjacent to a side surface of the board.

The at least two of the first radiator, the second radiator, the third radiator, and the fourth radiator may be spaced apart from each other at a preset interval, and a radiation pattern direction of the radiator may be determined based on the preset interval.

The feeder may include at least one via to electrically connect interlayers of the board to each other.

The antenna feeder may be made of a conductive metals including any one or any combination of copper (Cu), nickel (Ni), aluminum (Al), silver (Ag), or gold (Au).

Other features and aspects will be apparent from the following detailed description, the drawings, and the claims.

Figure 1:
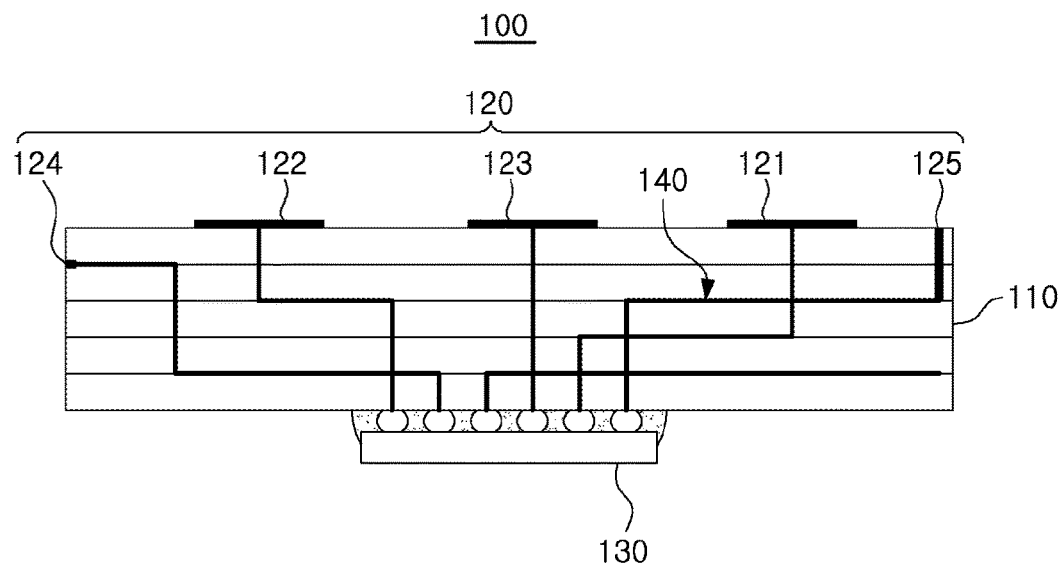
FIG. 1 is diagram illustrating an example of a mounting module.

Throughout the drawings and the detailed description, unless otherwise described or provided, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations is described as an example; the sequence of operations is not limited to that set forth herein and may be changed as is known in the art, with the exception of steps and/or operations that necessarily occur in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure is thorough, complete, and conveys the full scope of the disclosure to one of ordinary skill in the art.

FIG. 1 is a diagram illustrating an example of a mounting module.

Referring to FIG. 1, a mounting module 100 may include a board 110, an antenna 120, an RF circuit unit 130, and a feeding line 140.

The board 110 may be provided with a mounting electrode. Two surfaces of the board 110 may be parallel with each other. In an example, the board 110 may comprise any one of a ceramic board, a printed circuit board (PCB), or a flexible board.

The antenna 120 may be mounted on one surface of the board 110. One surface of the board 110 does not refer to only an upper surface of the board 110 in a cross-sectional view. In one example, the antenna 120 may be mounted on the upper surface of the board 110. In another example, the antenna 120 may be mounted on a side surface of the board 110 to be parallel to the side surface. In another example, the antenna 120 may be mounted on a side surface of the board 110 to be perpendicular to the side surface. Therefore, the mounting module 100 may precisely control a radiation pattern direction of an RF signal in three dimensions based on the mounting of the antenna 120.

The antenna 120 may include an interlayer antenna 124, which is formed in an inner layer of the board 110. In an example, the interlayer antenna 124 may be disposed in parallel with the board 110 on the side surface of the board 110 when viewed in a cross-sectional view. In the cross-sectional view, since a horizontal length of the side surface of the board is longer than a vertical length thereof, the interlayer antenna 124 may be implemented in a dipole antenna form.

For example, the antenna 120 may include a via antenna 125 which is formed in a region of the interior of the board adjacent to the side surface of the board 110. In an example, the via antenna 125 may be disposed to be perpendicular to the board 110 in the region of the board adjacent to the side of the board 110 when viewed from a cross-sectional view. The via antenna 125 may be implemented as at least one via stack in consideration of criteria such as, for example, a frequency, wavelength or an interlayer thickness of a Printed Circuit Board (PCB).

When viewed in a cross-sectional view, a horizontal length of the side surface of the board is shorter than a vertical length, the via antenna 125 may be implemented in a monopole antenna form. For example, the via antenna 125 may be implemented in the monopole antenna form in which two vias are connected to each other in series, as illustrated in FIG. 1.

The antenna 120 may radiate or receive an RF signal in a millimeter wave band according to a design of the mounting module 100. The wavelength of the RF signal in the millimeter wave band is short, and therefore the antenna 120 may be miniaturized.

An RF circuit unit 130 may be mounted on the other surface of the board 110 by the mounting electrode. The RF circuit unit 130 may be mounted on a surface of the board 110 on which the antenna 120 is not disposed. For example, as illustrated in FIG. 1, the RF circuit unit 130 may be mounted on a lower surface of the board 110. A detailed example of the RF circuit unit 130 will be described below with reference to FIGS. 3 and 4.

The feeding line 140 may electrically connect the RF circuit unit 130 and the antenna 120 through the board 110. In an example, the feeding line 140 may be formed in the board 110 and may be formed of conductive metals such as, for example, copper (Cu), nickel (Ni), aluminum (Al), silver (Ag), and gold (Au).

A distance between the RF circuit unit 130 and the antenna 120 may be relatively shorter than that between the existing RF circuit unit and an external antenna. Therefore, the mounting module 100 may reduce a loss of signal power and reduce deterioration in reflective characteristics due to the connection between the antenna 120 and the RF circuit unit 130.

Figure 2:
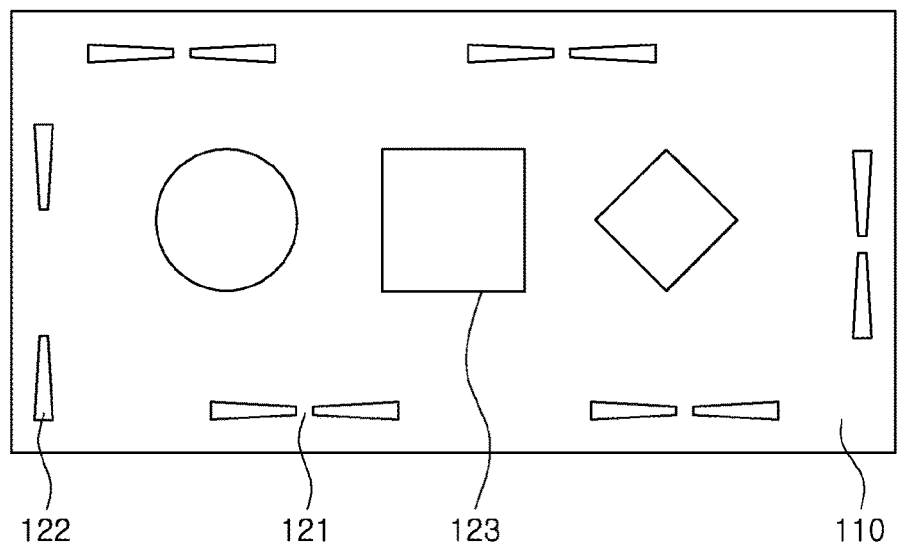
FIG. 2 is a diagram illustrating an example of an upper surface of the mounting module.

FIG. 2 is a diagram illustrating an example of an upper surface of the mounting module.

Referring to FIG. 2, the antenna included in the mounting module may include at least one of a dipole antenna 121, a monopole antenna 122, or a patch antenna 123.

The dipole antenna 121 and the monopole antenna 122 may be close to an edge of the upper surface of the mounting module. The dipole antenna 121 and the monopole antenna 122 may transmit or receive an RF signal in a lateral direction of the mounting module.

The patch antenna 123 may be close to a center of the upper surface of the mounting module. The patch antenna 123 may transmit or receive an RF signal in an upward direction of the mounting module. The patch antenna 123 may be in a shape, such as, for example, polygonal, and circle.

For example, the antenna 120 may include at least one of the dipole antenna 121, the monopole antenna 122, and the patch antenna 123. Therefore, the antenna 120 may transmit or receive an RF signal in an inclined direction from the upward direction of the mounting module toward the lateral direction.

In an example, a radiation pattern direction of the RF signal may be controlled according to an interval between at least one of the dipole antenna 121 and the monopole antenna 122 and the patch antenna 123. In another example, a radiation pattern direction of the RF signal may be controlled according to a ratio of the number of at least one of the dipole antennas 121 and the monopole antennas 122 to the number of patch antennas 123. In yet another example, a radiation pattern direction of the RF signal may be controlled according to a combination of the above-described interval and the above-described ratio.

For example, as the dipole antenna 121 and the monopole antenna 122 are close to the patch antenna 123, the radiation pattern direction of the RF signal may approach the upward direction of the mounting module.

For example, when the total number of dipole antennas 121 and monopole antennas 122 is more than the number of patch antennas 123, the radiation pattern direction of the RF signal may approach the lateral direction of the mounting module.

Further, the radiation pattern direction of the RF signal may be controlled, according to positions or directions of the dipole antenna 121 and the monopole antenna 122. That is, the mounting module 100 may precisely control the radiation pattern direction of the RF signal in three dimensions.

Figure 3:
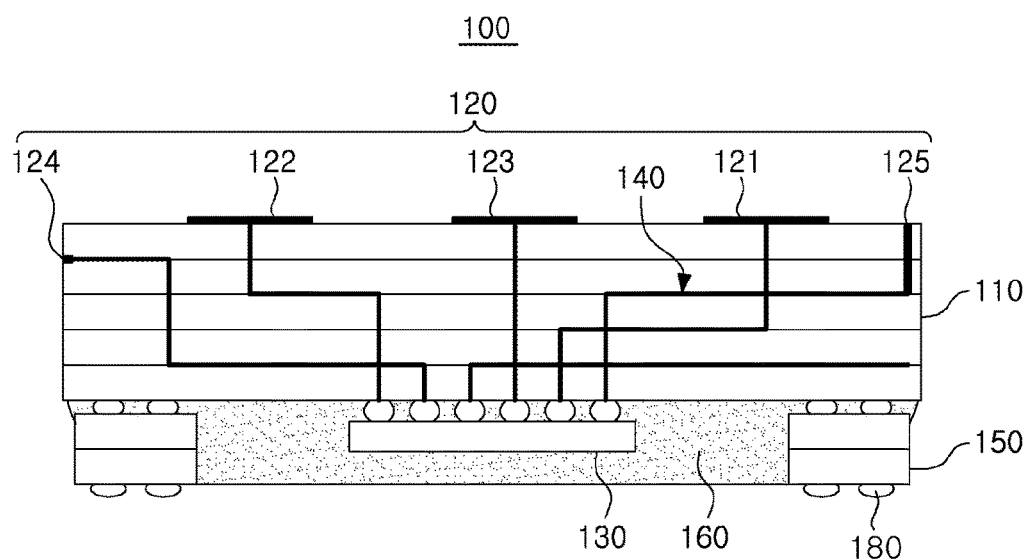
FIG. 3 is a diagram illustrating an example of a frame included in the mounting module.
Figure 4:
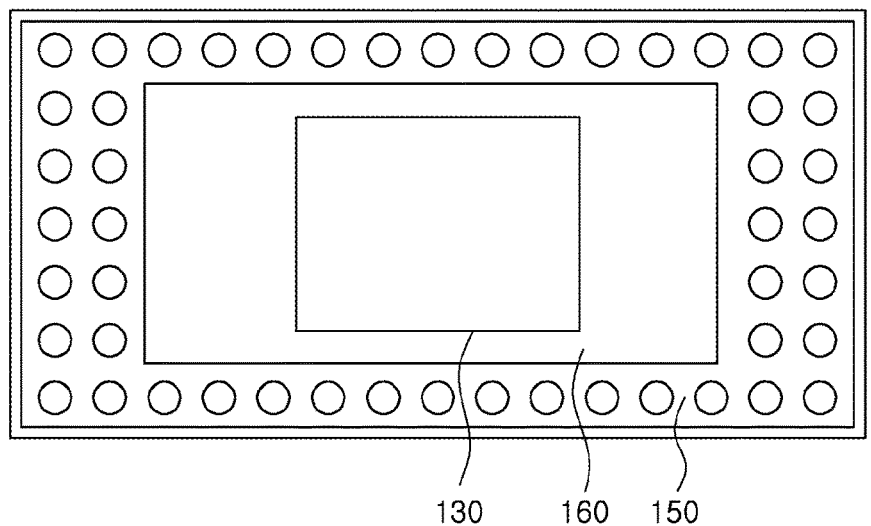
FIG. 4 is a diagram illustrating an example of a lower surface of the mounting module.

FIG. 3 is a diagram illustrating an example of a frame included in the mounting module. FIG. 4 is a diagram illustrating an example of the lower surface of the mounting module. Referring to FIGS. 3 and 4, the mounting module 100 may further include a frame 150. The frame 150 may be disposed on the other surface of the board 110 to enclose the RF circuit unit 130. An area of the board enclosed by the frame 150 may be filled with an epoxy molding compound (EMC) resin 160 for electromagnetic wave shielding.

For example, the RF circuit unit 130 may include components, such as, for example, multiplexed analog components (MAC) and a base band signal processing circuit. To protect the RF circuit unit 130 from being physically damaged, the frame 150 may be disposed on the other surface of the board 110. A height of the frame 150 may be greater than that of the RF circuit unit 130.

A lower end of the frame 150 may be provided with a plurality of solder balls 180 to easily mount the mounting module 100 in devices, such as, for example, mobile terminals, laptop PCs, and TVs.

Figure 5:
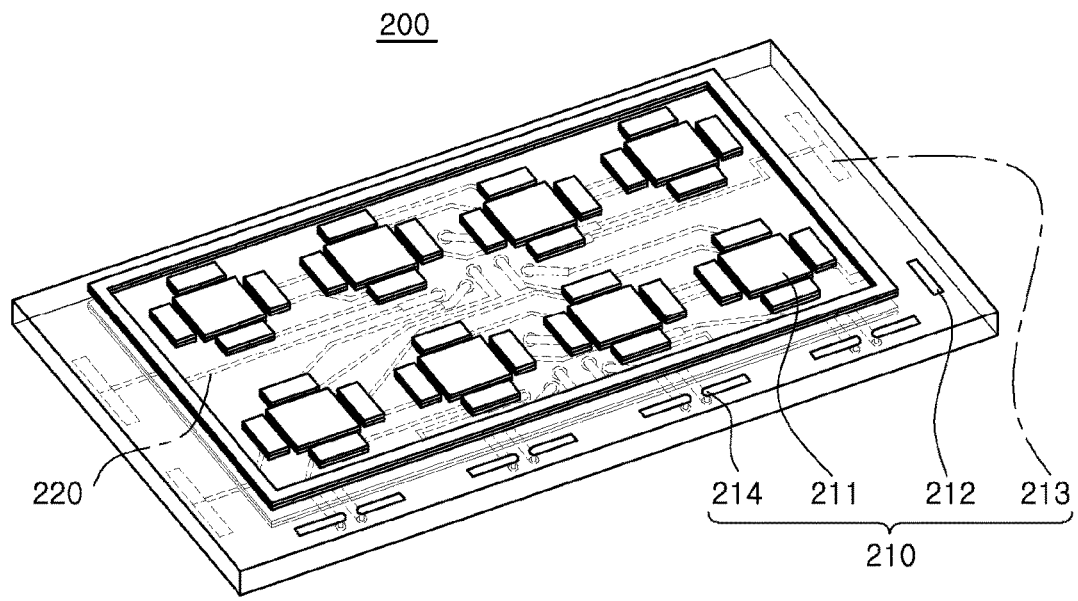
FIG. 5 is a diagram illustrating an example of an antenna apparatus.

FIG. 5 is a diagram illustrating an example of the antenna apparatus. Some of the components shown in FIG. 5 have been described with reference to FIGS. 1-4. The above description of FIGS. 1-4, is also applicable to FIG. 5, and is incorporated herein by reference. Thus, the above description may not be repeated here.

Referring to FIG. 5, the antenna apparatus 200 may include a radiator 210 and a feeder 220.

The radiator 210 may be disposed on one surface of the board to transmit or receive the RF signal. For example, the radiator 210 may include at least two of first to fourth radiators 211 to 214. Therefore, the antenna apparatus 200 may precisely control the radiation pattern direction of the RF signal in three dimensions.

The first radiator 211 may be disposed in a first area including the center of one surface of the board. Characteristics of the first radiator 211 may be similar to those of the patch antenna included in the mounting module.

The second radiator 212 may be disposed in a second area including an edge of one surface of the board. Characteristics of the second radiator 212 may be similar to those of the dipole antenna or the monopole antenna included in the mounting module.

The third radiator 213 may be disposed in the interior of the board. Characteristics of the third radiator 213 may be similar to those of the interlayer antenna included in the mounting module.

The fourth radiator 214 may be disposed in a region of the board adjacent to the side surface of the board. Characteristics of the fourth radiator 214 may be similar to those of a via antenna included in the mounting module.

For example, at least two of the first radiator 211, the second radiator 212, the third radiator 213, and the fourth radiator 214 may be spaced apart from each other at a preset interval. Therefore, the radiation pattern direction of the radiator 210 may be determined based on the preset interval.

The feeder 220 may receive the RF signal through the other surface of the board and may transmit the RF signal to the radiator 210.

For example, the feeder 220 may include at least one via through which a plurality of interlayers of the board is electrically connected to each other.

Figure 6:
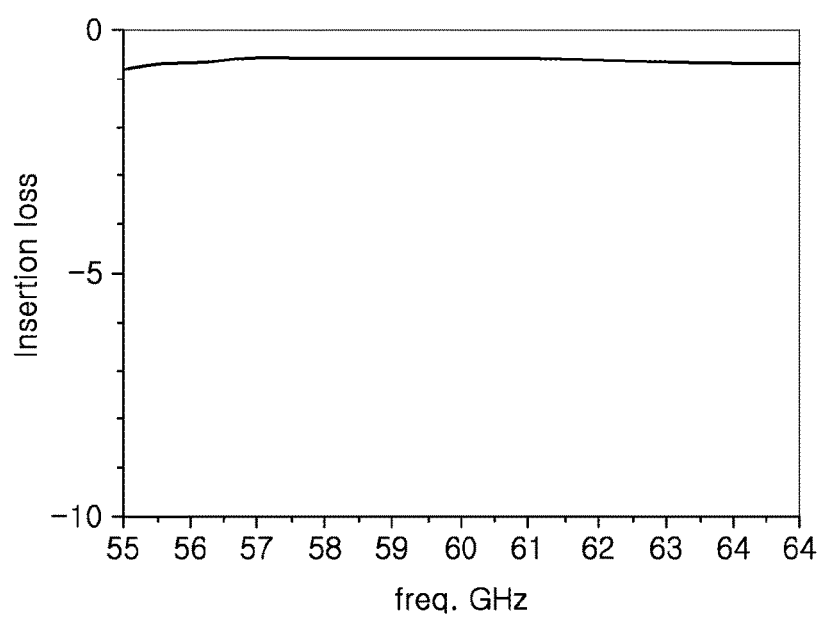
FIG. 6 is a diagram illustrating an example of insertion loss of the mounting module.

FIG. 6 is a diagram illustrating an example of insertion loss of the mounting module. Referring to the graph of FIG. 6, horizontal axis represents a frequency of the RF signal and vertical axis represents the insertion loss of the feeding line. The insertion loss of the antenna apparatus may be equal to or less than 1 dB. Considering that the insertion loss of 7 dB or higher may occur due to a connection between an existing RF circuit and an external antenna, it can be seen that the insertion loss of the antenna disclosed above is significantly improved.

Figure 7:
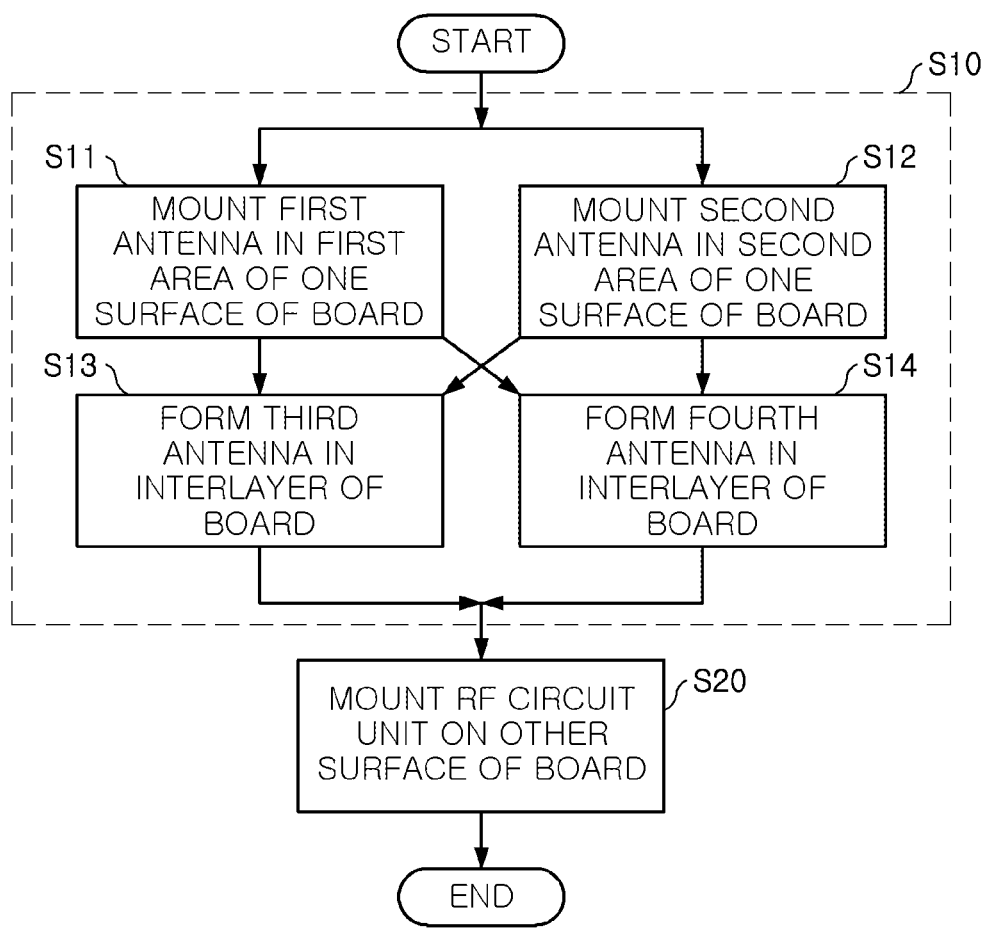
FIG. 7 is a diagram illustrating an example a method of manufacturing a mounting module.

FIG. 7 is a diagram illustrating an example of a method of manufacturing a mounting module. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently. The above descriptions of FIGS. 1-5, is also applicable to FIG. 7, and is incorporated herein by reference. Thus, the above description may not be repeated here.

Referring to FIG. 7, the method of manufacturing a mounting module may include mounting an antenna in S10 and mounting a circuit in S20.

In S10, a plurality of antennas may be mounted on one surface of the board included in the mounting module. The plurality of antennas may be spaced apart from each other at a preset interval to allow the radiation pattern directions of the plurality of antennas to be in preset directions.

For example, the mounting of the antenna S10 may include at least two of mounting the first antenna in the first area including the center of one surface of the board in S11, mounting the second antenna in the second area including the edge of one surface of the board in S12, forming the third antenna in the interlayer of the surface in S13, and forming the fourth antenna in a region of the board adjacent to the side surface of the board in S14.

In S20, the RF circuit unit may be mounted on the other surface of the board included in the mounting module.

As set forth above, the mounting module may reduce the loss of signal power and deteriorations in reflective characteristics due to connections between the antenna and the RF circuits. The antenna apparatus may precisely control the radiation patterns in three dimensions. The method of manufacturing a mounting module may include mounting the antenna array having the radiation patterns precisely controlled in three dimensions and the RF circuits on the mounting module.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A module, comprising:
    a board;
    antennas mounted on a first surface of the board configured for transmitting and/or receiving an RF signal;
    an RF circuit unit mounted on a second surface of the board configured for processing the RF signal;
    feeding lines connecting the RF circuit unit and the antennas through the board;
    a frame disposed on the second surface of the board to enclose the RF circuit unit,
    wherein one of the feeding lines comprises a first section disposed parallel to the antennas and a second section disposed perpendicular to the antennas, and an area of the board enclosed by the frame being filled with an epoxy molding compound (EMC) resin for electromagnetic wave shielding.

2. The module of claim 1, wherein the antennas comprise any one or any combination of a dipole antenna, a monopole antenna, and a patch antenna.

3. The module of claim 2, wherein when the antennas comprise the patch antenna, the patch antenna is disposed at an intermediate surface portion closer to a center of the first surface than either the dipole antenna or the monopole antenna.

4. The module of claim 1, further comprising an interlayer antenna disposed in the interior of the board.

5. The module of claim 1, further comprising a via antenna disposed adjacent to a side surface of the board.

6. The module of claim 5, wherein the via antenna is perpendicular to the first surface.

7. The module of claim 5, wherein the via antenna is implemented in consideration of at least one of a frequency, a wavelength, or an interlayer thickness of a Printed Circuit Board (PCB).

8. The module of claim 1, wherein the antennas comprise a patch antenna disposed between a monopole antenna and a dipole antenna.

9. The module of claim 2, wherein the RF circuit unit has a width smaller than a width of the board.

10. The module of claim 8, wherein a horizontal distance between the monopole antenna and the dipole antenna is greater than a width of the RF circuit unit.

11. The module of claim 4, wherein the interlayer antenna is disposed in a dipole antenna form.

12. The module of claim 1, wherein the first section is parallel to the first surface and the second section perpendicular the first surface.

13. A module, comprising:
a board;
antennas mounted on a first surface of the board configured for transmitting and/or receiving an RF signal;
an RF circuit unit mounted on a second surface of the board configured for processing the RF signal; and
feeding lines connecting the RF circuit unit and the antennas through the board,
wherein one of the feeding lines comprises a first section disposed parallel to the antennas and a second section disposed perpendicular to the antennas,
wherein the antennas comprise any one or any combination of a dipole antenna, a monopole antenna, and a patch antenna, and
wherein in response to a number of dipole antennas and monopole antennas exceeding a number of patch antennas, a radiation pattern direction of the RF signal approaches the lateral direction of the mounting module.

14. A module, comprising:
a board;
antennas mounted on a first surface of the board configured for transmitting and/or receiving an RF signal;
an RF circuit unit mounted on a second surface of the board configured for processing the RF signal;
feeding lines connecting the RF circuit unit and the antennas through the board; and
a via antenna disposed adjacent to a side surface of the board,
wherein one of the feeding lines comprises a first section disposed parallel to the antennas and a second section disposed perpendicular to the antennas, and
wherein the via antenna is disposed in a monopole antenna form in which two vias are connected to each other in series.

* * * * *